United States Patent [19]

Weir

[11] 4,336,526

[45] Jun. 22, 1982

[54] SUCCESSIVE APPROXIMATION ANALOG-TO-DIGITAL CONVERTER USING NON-BINARY SERIES

[75] Inventor: Basil Weir, San José, Calif.

[73] Assignee: Intersil, Inc., Cupertino, Calif.

[21] Appl. No.: 142,644

[22] Filed: Apr. 22, 1980

Related U.S. Application Data

[63] Continuation of Ser. No. 931,166, Aug. 4, 1978, abandoned.

[51] Int. Cl.³ ............................................. H03K 13/05
[52] U.S. Cl. ...................... 340/347 AD; 340/347 DA; 340/347 CC
[58] Field of Search ... 340/347 AD, 347 M, 347 DA, 340/347 CC

[56] References Cited

U.S. PATENT DOCUMENTS 3,175,212  3/1965  Miller ........................... 340/347 AD
3,216,001  11/1965  Hinrichs ....................... 340/347 AD
4,097,753  6/1978  Cook ............................. 340/347 AD

OTHER PUBLICATIONS

Rullgard "IBM Technical Disclosure Bulletin" vol. 10, No. 1, Jun. 1967, pp. 5–6.
MOS/LSI Standard Products Catalog from Texas Instruments, Jul. 1971, pp. 125–131.
Stakhov et al., "Instrument Designing" vol. XVIII, No. 4, 1975, pp. 47–52.

Primary Examiner—Charles D. Miller
Attorney, Agent, or Firm—Spensley, Horn, Jubas & Lubitz

[57] ABSTRACT

In this successive approximation analog-to-digital converter non-precise impedance elements are used in a circuit which provides successive analog step values that approximate a non-binary series in which (above a certain minimum) each term is smaller than the sum of the preceding series terms. The actual values of the analog quantities that are produced by the corresponding individual impedance elements are stored in digital format in a memory. These quantities are measured and stored with an accuracy which exceeds the accuracy expected for the final operation of the system. At each conversion step, the unknown analog input is compared with the sum of a pair of step values, the smaller of which is greater than the maximum expected comparator error. An acceptable comparator output may be obtained before the comparator has completely settled. If the comparator output indicates that the unknown input is greater than the compared analog value, the larger term is retained for inclusion in subsequent comparison steps. The actual value of the retained term is accessed from the memory and summed in an accumulator which contains, at the end of the comparison cycle, the digital value of the analog input.

17 Claims, 1 Drawing Figure

SUCCESSIVE APPROXIMATION ANALOG-TO-DIGITAL CONVERTER USING NON-BINARY SERIES

This is a continuation of application Ser. No. 931,166 filed Aug. 4, 1978, now abandoned.

BACKGROUND OF THE INVENTION

1. Field of the Invention

The present invention relates to a successive approximation analog-to-digital converter, and particularly to such a converter in which a non-binary sequence is employed, and which does not require precise components.

2. Description of the Prior Art

A successive approximation analog-to-digital (A/D) converter provides a digital output which indicates the magnitude of an unknown analog input signal. The output may be a decimal number such as "4.25" or a binary number such as "10.01" which signifies some multiplier times a standard unit such as the "volt".

A convention successive approximation A/D converter employs a digital-to-analog converter (DAC) in a feedback loop with a comparator and a logic circuit referred to as a "successive approximation register". In the standard system, a binary sequence is employed. Initially the most significant binary bit (MSB) is set to one, and all lower bits are set to zero. The DAC then produces an analog voltage corresponding to the value of that most significant bit. For example, in a 10-bit system, the DAC initially would produce a voltage of $2^9 = 512$ volts. If this voltage is less than the analog input, the MSB is left at one. If the DAC output is greater than the input, the bit is set to zero.

The successive approximation register then moves on to the bit of next lower significance. This bit is set to one, and the resultant DAC output again is compared to the unknown analog input. If the DAC output is less than the input, this bit is left at one; if not, the bit is set to zero. The process is repeated successively for all bits. At the completion of the conversion, those bits left in the one state produce an output voltage from the DAC which should match the analog input to within $\pm\frac{1}{2}$ LSB. Performing an "n" bit conversion requires only "n" trials, making the technique capable of high speed conversion.

In the conventional successive approximation converter employing a binary sequence, the digital-to-analog converter uses an impedance network in which the elements correspond to values of the binary sequence. For example, the DAC may employ a set of resistors which are selected to produce voltages or currents having values of 512, 256, 128, 64, 32, 16, 8, 4, 2 and 1.

With this embodiment, during the successive approximation operation, the resistor or other impedance element having the value 512 initially is switched into the circuit. The comparator then compares the resultant current or voltage with the analog input. If, for example, the unknown signal is 328.3 volts, the comparator determines that this value is less than 512 volts produced by the DAC. As a result, the MSB is reset to zero, and the next bit is set to one. The analog input again is compared to the DAC output, which now is 256 volts. Since the unknown value (328.3 volts) is greater than 256 volts, this bit is kept in, and the next bit (having the binary weight 128) now is switched to one. Since the analog value is less than the sum of 256 plus 128, the bit corresponding to 128 is taken out and the next successive bit (having a value of 64) is put in. The process is repeated for all bits. At the end of the conversion, the bits having the weights of 256, 64 and 8 will remain set to one, so that the binary output code is 0101001000, this being the binary representation of 328. This system can only represent 328.3 (the unknown value) to an accuracy of 328, i.e., to within the value "1" of the least significant bit (LSB).

To ensure that this system gives a correct representation of the unknown analog input, two requirements must be met. First, each DAC element in the series must be accurate in value to a degree which is less than magnitude of the smallest element in the series. In the above example, each resistor or other impedance element must be accurate to within 1 unit. Secondly, the detector which compares the value corresponding to the sum of the inserted elements with the unknown value must be given enough time to register differences which are smaller than the magnitude of the smallest element. In practice, most comparators require a certain time for transient responses to settle out before a valid reading can be obtained. The more fine the requirement for accuracy, in general, the longer is the time required for the settling of transients. This settling time limits the speed at which accurate conversions can be made.

With regard to the first of these requirements, it is generally difficult to manufacture a resistor or other impedance element so as to have the precise desired value. However, since such precision is necessary to ensure that the DAC output is of the exact value at each step, the cost of fabrication of the converter is increased. On the other hand, it is usually easier and cheaper to measure an element accurately after it is manufactured than to manufacture it to a precise, certain value. An object of the present invention is to provide an analog-to-digital converter which utilizes components that need not be manufactured to precise values. The present invention utilizes DAC components which need not have specific values, so long as the actual value of each component is exactly known. Since this simplifies the manufacturing requirements, lower cost is achieved.

The second requirement listed above results in part because in the binary series (1, 2, 4, 8, 16, 32, . . . ) the sum of the first n elements is equal to the $(n+1)^{th}$ element less one. For examnple:

$$1+2+4+8+16=32-1$$

Thus, in a successive approximation A/D converter using a binary series, if an error occurs in the comparison between the DAC output and the unknown input for a certain DAC step, the error can not be compensated for in later steps. For example, suppose that the unknown analog input has a value of 17. Suppose further that when the DAC output is supposed to be "16" an error occurs, and the comparator indicates that the unknown signal is less than the DAC output. This error could result because the impedance element in the DAC was of incorrect value, or more likely, because of erroneous comparator operation due, e.g., to insufficient settling time to eliminate transient responses. As a result, the "16" bit will be set to zero. The sum of the remaining bits (having binary weights 1, 2, 4 and 8) is 15, which is less than the actual unknown value of 17. As a result, even though these four bits all will be set to one, the resultant converter digital output will have a value of 15 (i.e., binary 01111), which is an incorrect representation of the true analog input value 17.

Another object of the present invention is to provide a successive approximation A/D converter which does not employ a binary series, and in which an error in comparison at one step of the DAC output can be compensated for during subsequent DAC output steps. By employing a non-binary sequence in which the sum of the preceding series elements exceeds the value of the next element, the comparator accuracy requirements are substantially reduced. This leads to another object of the present invention, which is to provide an A/D analog converter in which the comparator accuracy requirements are reduced, and hence in which a shorter time is required for the settling of transients to a degree sufficient to obtain conversions of the desired resolution. Thus a corresponding objective of the present invention is to provide a successive approximation A/D converter having a shorter conversion time than prior art units of like precision, or having greater measurement resolution (e.g., more binary bits in the converted output) than a prior art converter operating with the same conversion time interval.

SUMMARY OF THE INVENTION

These and other objectives are achieved by providing a successive approximation A/D converter which utilizes a series of the form:

$$ka^0, ka^1, ka^2, ka^3, ka^4, \ldots, ka^n \quad \text{(equation 1)}$$

where $1 < a < 2$ and k is any number. For example, if $a = 1.8$ and $k = 1$, the above series will have the values:

$1, 1.8, 1.8^2, 1.8^3, 1.8^4, 1.8^5, \ldots, 1.8^n$ or:

$1, 1.8, 3.24, 5.832, 10.498, 18.896$.

A characteristic of such a series is that for values of $n > m$, where m is a fixed number which depends on the value of a, each term will be less than the sum of all prior terms. That is:

$$\sum_{n=0}^{i} ka^n > ka^{(i+1)} \text{ for } \begin{cases} 1 < a < 2 \\ n > m \end{cases}$$

In the above example ($a = 1.8$), the value of m is 2. Thus, for the fourth ($n = 3$) and succeeding terms, each term is less in value than the sum of the preceding terms. For example, the fifth ($n = 4$) term has the value $1.8^4 = 10.498$ which is less than the sum (11.872) of the preceding terms.

In the inventive converter, the DAC steps have nominal values in accordance with the non-binary series given above. Each specific resistor or impedance element in the DAC need not have the precise value of the corresponding term in the series. However, the exact value of the actual impedance element, as measured at the time of manufacture, is stored in a memory that is part of the converter.

At each conversion step, an analog signal corresponding to the sum of two or more series values is compared with the unknown analog input. If the unknown value is greater than this sum, the largest term included in the sum is retained, and the smaller value or values is deleted. This process is repeated for successive steps. As each comparison is completed, the exact value of the series term that is retained, if any, is added to the contents of an accumulator to obtain a digital output which corresponds to the unknown analog input. These exact values are obtained from the actual value memory mentioned above.

At each step, the value of any non-retained term can be more than made up by the sum of remaining (but individually lesser valued) terms in the series. As a result, it is not necessary that the comparator error for each step be less than the value of the least significant term in the employed series. Indeed, as described below, a substantially larger error can be tolerated at each comparison, while yet obtaining an overall conversion error that is less than the value of the smallest element of the series.

BRIEF DESCRIPTION OF THE DRAWINGS

A detailed description of the invention will be made with reference to the accompanying drawings wherein.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention since the scope of the invention best is defined by the appended claims.

Figure 1:
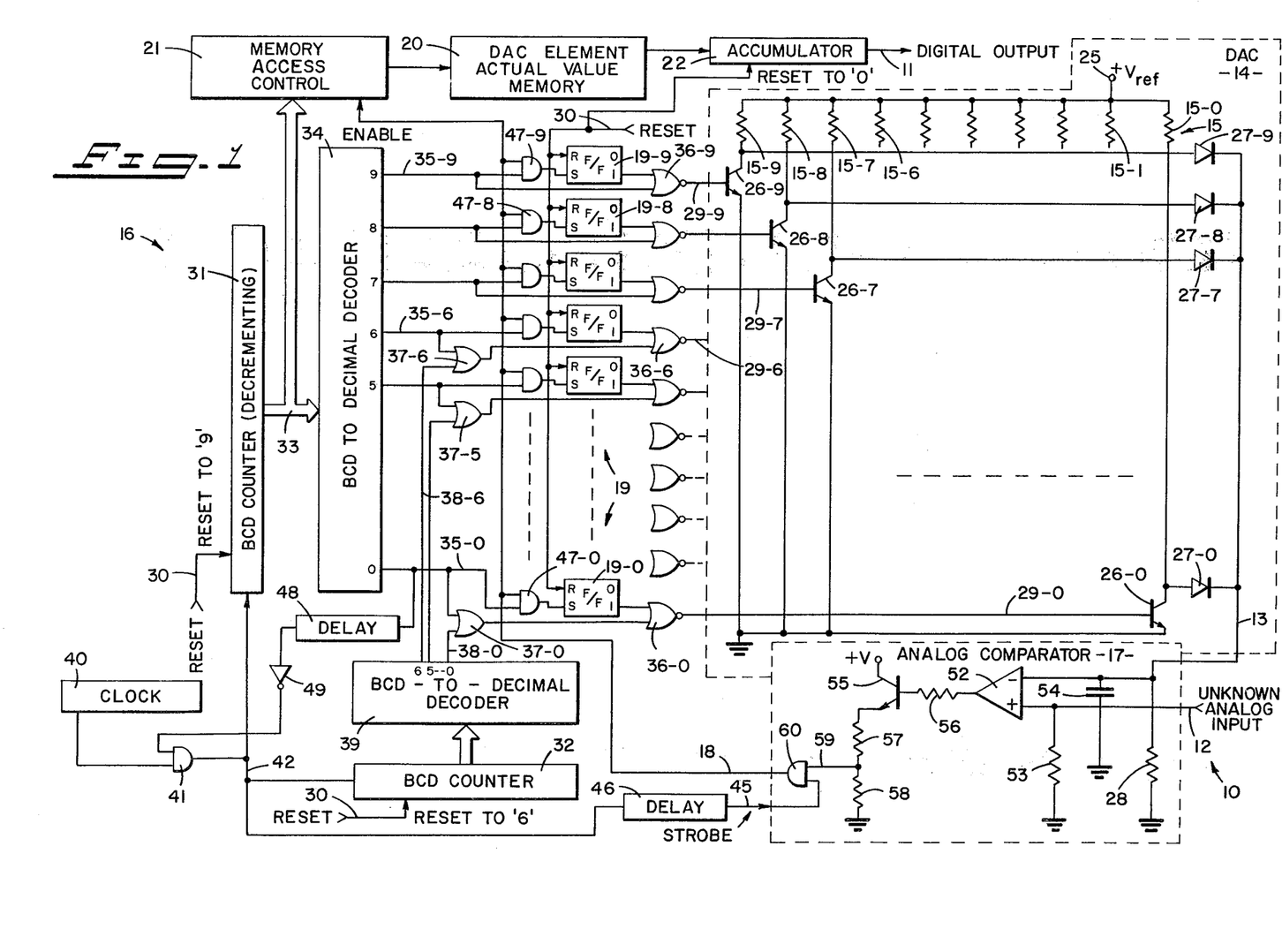
FIG. 1 is an electrical block diagram of a successive approximation analog-to-digital converter in accordance with the present invention.

An illustrative embodiment of the inventive successive approximation analog-to-digital converter 10 is shown in FIG. 1. This converter 10 produces on an output line 11 a digital signal representing the magnitude of an unknown analog signal supplied to an input line 12. The conversion is accomplished by successively comparing the unknown analog input with an analog signal supplied via a line 13 from a digital-to-analog converter (DAC) 14 which employs non-precision resistors 15. The DAC 14 is controlled by appropriate successive approximation control logic 16 described in detail below.

The resistance elements 15 are selected so that the DAC 14 can produce signals having magnitudes corresponding to the nonbinary series of equation 1 above. For all but the last few steps of the successive approximation, the control logic 16 directs the DAC 14 to provide an output signal which is the sum of two terms in this series. If the resultant DAC 14 output signal is less than the magnitude of the unknown analog input, an analog comparator 17 produces a signal on a line 18 which directs the control logic 16 to retain the larger of the two series terms for inclusion in all successive approximations. This is accomplished by setting a corresponding one of a set of flip-flops 19.

The actual, exact value of the analog parameter (e.g., voltage or current) which would be produced as an output of the DAC 14 as a result of the insertion of each individual resistance element 15 is stored in a memory 20. The signal on the line 18 also enables a memory access control circuit 21 to read out from the memory 20 the actual parameter value corresponding to each DAC impedance element which is "retained" during successive steps of the approximation. These actual values are summed in an accumulator 22 the contents of which, at the end of the conversion cycle, constitutes the digital value which is supplied as an output on the line 11.

In accordance with the present invention, the DAC resistance elements 15 need not have the precise values required to produce analog voltages or currents in the exact ratios of the series given by equation 1. What is required, however, is that the step values produced by the resistors 15 be known, and that these values be stored in the actual value memory 20. For example, in an illustrative embodiment employing the non-binary series of equation 1, where k=1 and a=1.8, the resistance elements 15-0 through 15-9 may have actual values which produce analog signals on the line 13 in the ratios listed in the following Table 1.

TABLE I

DAC ELEMENT ACTUAL VALUE MEMORY

| MEMORY ADDRESS (n) (RESISTANCE ELEMENT 15-n) | ELEMENT NOMINAL VALUE (NOT STORED) | | ELEMENT ACTUAL VALUE (TYPICAL) |
| --- | --- | --- | --- |
| 0 | $1.8^0 =$ | 1.000 | 1.013 |
| 1 | $1.8^1 =$ | 1.800 | 1.832 |
| 2 | $1.8^2 =$ | 3.24 | 3.198 |
| 3 | $1.8^3 =$ | 5.832 | 5.609 |
| 4 | $1.8^4 =$ | 10.498 | 10.727 |
| 5 | $1.8^5 =$ | 18.896 | 19.249 |
| 6 | $1.8^6 =$ | 34.012 | 33.381 |
| 7 | $1.8^7 =$ | 61.222 | 63.758 |
| 8 | $1.8^8 =$ | 110.200 | 115.536 |
| 9 | $1.8^9 =$ | 198.359 | 189.470 |

In the DAC 14 of FIG. 1, one end of each resistance element 15 is connected via a common terminal 25 to a reference voltage source having a value +Vref. The other terminal of each resistor 15-0 through 15-9 is connected to ground via a corresponding transistor 26-0 through 26-9 and to the line 13 via a corresponding diode 27-0 through 27-9. The line 13 is connected to ground via a resistor 28. Normally, all of the transistor base input lines 29-0 through 29-9 are high (binary "1"), so that all of the transistors 26-0 through 26-9 are conducting. As a result, the line 13 is effectively clamped to ground. If any of the DAC input lines 29-0 through 29-9 becomes low (i.e., is set to binary "0"), the corresponding transistor 26-0 through 26-9 will be turned off, causing the signal on the line 13 to rise to a value determined by the corresponding resistance element 15. For example, if the line 29-7 goes low, the transistor 26-7 will turn off, and current will flow from the +Vref terminal 25 through the resistor 15-7, the diode 27-7, the line 13 and the resistor 28 to ground. As result, the voltage which appears across the resistor 28 as an input to the analog comparator 17 will be determined by the value of the reference voltage +Vref and the values of the resistors 15-7 and 28. Thus when different ones of the resistors 15-0 through 15-9 are effectively switched into the DAC output circuit, the signals appearing at the line 13 will have the desired ratios in accordance with e.g., the values given in Table I.

Each analog-to-digital conversion cycle of the converter 10 is initiated by providing a "reset" pulse on a line 30. This pulse resets all of the flip-flops 19 to the "0" state, and resets the contents of the accumulator 22 to zero. Further, the pulse on the line 30 resets a pair of decrementing BCD counters 31, 32 to their initial values (herein "9" and "6" respectively). These counters 31, 32 control which resistance elements 15 are actuated in the DAC 14 during each successive approximation step.

To this end, the counter 31 is connected via a line 33 to a BCD-to-decimal decoder 34 which, in the embodiment of FIG. 1, has ten outputs "9" through "0" corresponding to the like contents of the counter 31. Each of these decoder 34 outputs is connected via a corresponding line 35-9 through 35-0 and a respective NOR-gate 36-9 through 36-0 to the corresponding DAC input line 29-9 through 29-0. For each of the lines 35-6 through 35-0 this connection is made via a respective OR-gate 37-6 through 37-0. The second input to each of these OR-gates 37-6 through 37-0 is the corresponding output line 38-6 through 38-0 of a BCD-to-decimal decoder 39 associated with the counter 32. The counters 31 and 32 are decremented at regular intervals by clock pulses supplied from a clock 40 via a normally enabled AND-gate 41 and a line 42.

At the first conversion step, the counter 31 is set to "9" and the counter 32 is set to "6". Accordingly, a high signal is supplied from the decoder 34 via the line 35-9 to the NOR-gate 36-9, so that the signal on the line 29-9 is low. As a result, the resistance element 15-9 is switched into the DAC 14 circuit. The decoder 39 provides a high signal on the line 38-6 which is supplied via the OR-gate 37-6 to the NOR-gate 36-6. As a result, the line 29-6 is low, causing the resistance element 15-6 also to be effectively connected to the DAC 14 output line 13. As a result the DAC 14 output signal represents the sum of the nominal values corresponding to the series terms $a^9$ and $a^6$ (equation 1). For the illustrative embodiment given (a=1.8), this corresponds to the nominal value (198.359+34.012=232.371). It is this value which is first compared to the unknown analog input supplied on the line 12.

The time at which the comparison is made by the analog comparator 17 is gated by a strobe pulse supplied on a line 45 by slightly delaying the clock pulse from the line 42 in a delay circuit 46. In this manner, the analog comparison may be accomplished after the comparator 17 has had some time to settle, but prior to occurrence of the next pulse from the clock 40. As discussed below, in accordance with the present invention, the settling time for the comparator 17 need not be as long as that required by prior art successive approximation converters to obtain the same or better conversion resolution.

In the event that the unknown analog input is less than the DAC 14 output (to within certain limits described below), the output of the comparator 17 on the line 18 will remain low. None of the flip-flops 19 will be set. On the other hand, if the unknown analog input is greater than the DAC output signal on the line 13 (again to within certain limits discussed below), the comparator output line 18 will be high. As a result, the flip-flop 19-9 associated with the enabled output line from the decoder 34 will be set to "1". This occurs since the decoder output line 35-9 is high, providing one input to an AND-gate 47-9 which is enabled by the high signal on the comparator output line 18. The resultant high output from the AND-gate 47-9 is supplied to the S input of the flip-flop 19-9 so as to set this flip-flop to the "1" output state. None of the other flip-flops 19 is set, since all of the AND-gates 47-8 through 47-0 receive low inputs from the corresponding decoder 34 output lines 35-8 through 35-0. Setting of the flip-flop 19-9 ensures that the resistance element 15-9 will remain in circuit with the DAC output line 13 for the remainder of the successive approximation cycle.

The high signal on the comparator output line 18 also enables the memory access control 21 to read out from the memory 20 the actual value of the resistance element 15-9. The storage address of that actual value is obtained by the control circuit 21 from the BCD counter 31 output signal present on the line 33. In the example of Table I, the stored element 15-9 actual value of 189.470 will be read from the memory 20 supplied to the accumulator 22 where it is summed with the prior contents (zero) thereof.

The next successive approximation step is initiated by the next pulse from the clock 40 which decrements the counter 31 to "8" and decrements the counter 32 to "5". The resultant outputs from the decoders 34 and 39 on the respective lines 35-8 and 38-5 place into circuit in the DAC 14 the resistors 15-8 and 15-5 (in addition to the resistor 15-9, which remains in circuit if the flip-flop 19-9 had been set at the first successive approximation step). If the flip-flop 19-9 was not previously set, two resistors 15-8 and 15-5 contribute nominal signals of 110.200 and 18.896 volts respectively to the signal on the line 13, so that the unknown analog input is compared with the sum 129.096 volts at this second successive approximation step. If the unknown input exceeds this value (by within some comparator 17 error range discussed below), a high signal again is obtained on the line 18. This signal causes setting of the flip-flop 19-8, so as to retain the resistance element 15-8 (corresponding to the nominal value $1.8^8 = 110.200$) for inclusion in subsequent comparisons. If the analog input is less than the value present on the line 13 from the DAC 14, the line 18 remains low and the flip-flop 19-8 is not set.

This process repeats for successive pulses from the clock 40. At the third step, the DAC resistance elements 15-7 and 15-4 are employed. At the fourth step, the resistors 15-6 and 15-3 are used. This continues through the seventh step at which the resistors 15-3 and 15-0 are employed. At the eighth and subsequent steps, the counter 32 (which has previously decremented to "0") provides no output, so that none of the lines 38-6 through 38-0 are high. However, during the eighth through tenth steps, the decoder 34 provides successive outputs on the lines 35-2 through 35-0 so that for these steps the resistance elements 15-2 through 15-0 are employed one at a time.

The conversion cycle ends after the tenth step, when the counter sd31 has decremented to "0". The resultant signal on the line 35-0 is delayed for some portion of a clock cycle in a delay circuit 48 and the resultant high signal is inverted by an inverter 49 so as to provide a low signal which disables the AND-gate 41, thereby preventing successive clock pulses from reaching the counters 31 and 32. At the end of this tenth step, the contents of the accumulator 22 will correspond to the sum of the actual values of those resistance elements 15 which were retained during successive comparison steps by high outputs from the comparator 17. In other words, the contents of the accumulator 22 will then represent in digital form the value of the unknown analog input. This digital output is provided on the channel 11 in either serial or parallel form.

In the analog comparator 17 of FIG. 1, the unknown input is applied to the non-inverting (+) input of an operational or differential amplifier 52 across an input resistor 53 which may have the same value as the resistor 28. The DAC output line 13 is connected to the inverting (−) input of the amplifier 52, the input capacitance of which is represented by the capacitor 54 in FIG. 1.

If the DAC 14 output exceeds the magnitude of the unknown analog input, more current will flow into the inverting (−) input of the amplifier 52 than into the non-inverting input thereof. As a result, the output of the amplifier 52 will be low, thereby turning off a transistor 55 the base of which is connected via a resistor 56 to the amplifier 52 output. This in turn produces a low voltage at the junction of a pair of resistors 57, 58 which are connected between the emitter of the transistor 55 and ground. The resultant low signal on a line 59 inhibits an AND-gate 60 so that a low signal will be produced on the line 18 upon occurrence of a strobe pulse on the line 45. Conversely, when the unknown analog input exceeds a magnitude the DAC output on the line 13, the amplifier 52 will provide a high output which turns on the transistor 55. As a result, the resistor 57 will be connected to a positive voltage source +V, so that the voltage on the line 59 will rise to a level sufficient to cause a high output to appear on the line 18 upon occurrence of the strobe pulse on the line 45.

A significant feature of the present invention involves the settling time required for accurate comparison by the comparator 17. It will be appreciated that as each subset of the resistance elements 15 is switched into circuit with the DAC output line 13, the voltage at the inverting input of the amplifier 52 does not immediately rise to the level designated by the values of the connected resistors. Rather, some delay is experienced in reaching this level, owing to the time required to charge the amplifier input capacitance 54. Thus at the time of occurrence of the strobe pulse on the line 45, the signal on the line 13 may not have reached the exact value designated by the selected resistors 15. Conversely, it is possible that as a result of switching transients, the magnitude of the signal from the line 13 may momentarily be higher than the nominal value. Under either situation, the comparator 17 can produce an erroneous output. In accordance with the present invention, within certain limits, this erroneous output can be tolerated and compensated for without impairing the accuracy and resolution of conversion.

This comparator error compensation results in part from the characteristics of the non-binary series (equation 1) employed in the A/D converter 10. In this series, each term (above a certain small-valued term) has a value which is less than the sum of the preceding terms. Accordingly, if an error is introduced by the comparator 17 which results in the erroneous non-retention of a certain term (i.e., of a certain one of the resistance elements 15), the corresponding value of that omitted resistance element can be made up at subsequent measurement steps.

Moreover, in accordance with the present invention, it is only necessary for the DAC 14 input to the comparator 17 to settle to within some percentage range (typically 3%) of the DAC output value of that step to achieve in accurate conversion. And as noted above, each resistance element 15 need not have the exact value of the corresponding non-binary series term, so long as the actual value of each element 15 is known. In this regard, each such resistance element 15 may vary by as much as say 5% from the corresponding series exact value, without impairing the accuracy or resolution of the analog-to-digital conversion. This may be contrasted to the requirements of a prior art successive approximation converter employing a binary series, wherein each DAC impedance element was required to correspond to the exact binary series value to within an error equal to the value of the smallest binary series element. By way of contrast, this required that the binary series element corresponding to the value "256"

needed to have a value of 256±1, whereas in the present invention, e.g., the resistor 15-9 corresponding to the term $1.8^9 = 198.359$ need only have a value within about 5% of this nominal value, i.e., it can have a value anywhere in the range of from about 188.44 to about 208.27 so long as the actual value is known for storage in the memory 20.

The manner in which the present invention compensates for incomplete settling or other error introduction by the comparator 17 best is described by way of an example. Consider the case in which the unknown analog input has a value of U=132.5 volts. At the first conversion step, the resistors 15-9 and 15-6 are switched into circuit, so that the signal on the line 13 corresponds to a nominal value of 189.470+33.381=222.851 volts established by the actual values of these resistors (see Table I). If the comparator 17 is allowed to settle only to within 3% of this nominal value, then the analog input will not be compared with the exact nominal value but will only be known within some range corresponding to the nominal value plus or minus the error of say 3%. In other words, a high signal on the line 18 will mean that the unknown signal is greater than the nominal DAC output value (222.851) minus the possible error (3%=6.69) i.e., that the unknown signal is greater than 216.16 volts. On the other hand, if the signal on the line 18 is low, this means that the unknown analog input is less than the nominal value plus the possible comparator 17 error, and hence is less than 222.851+6.69=229.54 volts. For the example where the unknown signal U=132.5 volts, the comparator 17 will unambiguously produce a low output signal on the line 18 for this first step.

At the second step the resistance elements 15-9 and 15-5 will be switched into circuit, so that the nominal value of the signal on the line 13 is 115.536+19.249=134.785 volts. However, owing to the charging time of the capacitor 54 and other possible sources of settling or transient response error in the comparator 17, the unknown analog input will only be compared within the exemplary error range of 3%. Thus a high signal on the line 18 will only indicate that the unknown input is greater than the normal DAC 14 output value minus the error, which in this case is 134.785−4.04=130.74. Conversely, a low output from the comparator 17 will only indicate that the unknown analog signal is less than the nominal DAC 14 output plus the nominal error limit of 3%, i.e., that the unknown signal is less than 134.785+4.04=138.83 volts.

In the example where the unknown signal U=132.5 volts, at the second step the analog comparator 17 may give either a high or a low output on the line 18, depending upon the amount of error actually introduced by the comparator 17 when the measurement is taken. If a high output is obtained, the flip flop 19-8 will be set and the resistor 15-8 (corresponding to an actual value of 115.536) will be retained in the DAC 14 circuit during all subsequent measurements. If a low output is obtained from the comparator 17, the resistor 15-8 will not be held in circuit. However, the absence of this resistance element 15-8 will be compensated for on subsequent steps, since the sum of the actual resistance elements 15-7 through 15-0 is 138.767 which is sufficient to make up the unknown value of 132.5 volts.

Making the assumption that on the second step the comparator 17 produces a low output on the line 18, the following steps 3 through 10 summarize the operation of the A/D converter 10 for the remainder of the conversion cycle, for the example where the unknown analog input U=132.5 volts.

Step 3

Insert resistors 15-7 and 15-4
DAC 14 output: (63.758+10.727)=74.485
Possible comparator 17 indications:
 high: U>74.785−3%=74.785−2.234=72.551
 low: U<74.785+3%=77.019
For U=132.5 have high output, so that flip-flop 19-7 will be set.
Add resistor 15-7 actual value (63.758) to accumulator 22; contents now (63.758).

Step 4

Insert resistors 15-6 and 15-3, resistor 15-7 remains inserted since flip-flop 19-7 is set.
DAC 14 output: (33.381+5.609+63.758)=102.748
Possible comparator 17 indications:
 high: U>102.748−(3% of newly added values)=102.748−(3% of 33.381+5.609)=102.748−1.170=101.578
 low: U<102.748+1.170=103.918
For U=132.5 have high output, so that flip-flop 19-6 will be set.
Add resistor 15-6 actual value (33.381) to accumulator 22; contents now (63.758+33.381=97.139).

Step 5

Insert resistors 15-5 and 15-2; resistors 15-7 and 15-6 remain inserted since flip-flops 19-7 and 19-6 are set.
DAC 14 output: (19.249+3.198+63.758+33.381)=119.586
Possible comparator 17 indications:
 high: U>119.586−(3% of newly added values)=119.586−(3% of 19.249+3.198)=119.586−0.673=118.913
 low: U<119.586+0.673=120.259
For U=132.5 have high output, so that flip-flop 19-5 will be set.
Add resistor 19-5 actual value (19.249) to accumulator 22; contents now (97.139+19.249=116.388).

Step 6

Insert resistors 15-4 and 15-1; resistors 15-7, 15-6 and 15-5 remain inserted.
DAC output: (10.727+1.832+116.388)=128.947
Possible comparator 17 indications:
 high: U>128.947−(3% of newly added values)=128.947−(3% of 10.727+1.832)=128.947−0.377=128.570
 low: U<128.947+0.377=129.324
For U=132.5 have high output, so that flip-flop 19-4 will be set.
Add resistor 19-4 actual value (10.727) to accumulator 22; contents now (116.388+10.727=127.115).

Step 7

Insert resistors 15-3 and 15-0; resistors 15-7 through 15-4 remain inserted.
DAC 14 output: (5.609+1.013+127.115)=133.737
Possible comparator 17 indications:
 high: U>133.737−(3% of newly added values)=133.737−(3% of 6.622)=133.737−0.199=133.538
 low: U<133.737+0.199=133.936
For U=132.5 have low output, so that flip-flop 19-3 will not be set.

Contents of accumulator 22 remain at 127.115

Step 8

Insert resistor 15-2; resistors 15-7 through 15-4 remain inserted.
DAC 14 output: (3.198+127.115)=130.313
Possible comparator 17 indications:
  high: U>130.313−(3% of newly added value)=130.313−(3% of 3.198)=130.313−0.096=130.217
  low: U<130.313+0.096=130.409

For U=132.5 have high output, so that flip-flop 19-2 will be set.

Add resistor 15-2 actual value (3.198) to accumulator 22; contents now (127.115+3.198=130.313).

Step 9

Insert resistor 15-1; resistors 15-7 through 15-4 and 15-2 remain inserted.
DAC 14 output: (1.832+127.115+3.198)=132.145
Possible comparator 17 indications:
  high: U>132.145−(3% of newly added value)
    =132.145−(3% of 1.832)
    =132.145−0.055=132.090
  low: U<132.145+0.055=132.200

For U=132.5 have high output, so that flip-flop 19-1 will be set.

Add resistor 15-1 actual value (1.832) to accumulator 22; contents now (130.313 +1.832=132.145)

Step 10

Insert resistor 15-0; resistors 15-7 through 15-4, 15-2 and 15-1 remain inserted.
DAC 14 output: (1.013+132.145)=133.158
Possible comparator 17 indications
  high: U>133.158−(3% of newly added value)
    =133.158−(3% of 1.013)
    =133.158−0.030=133.188
  low: U<133.158+0.030=133.188

For U=132.5 have low output, so that flip-flop 19-0 is not set.

Contents of accumulator 22 remain at 132.145 which equals the actual unknown analog value U=132.5 by within 0.27 percent error.

Thus, the foregoing example illustrates the manner in which the inventive A/D converter 10 will provide an accurate digital conversion of an unknown analog signal even though non-precise impedance elements 15 are employed in the DAC 14, and even though the analog comparator 17 itself may introduce a significant settling or transient response error into each individual comparison. In the example just given, the unknown analog value was converted to a digital value to within an error of 0.27% even though the individual resistance elements 15 were only within about 5% of the corresponding non-binary series (equation 1) values, and even though the comparator 17 itself may have introduced a settling error on each measurement of as much as 3%.

With respect to the comparator 17 error, note that at each step of the comparison the error is only a certain percentage of the newly added voltage increment from the DAC 14. This results since the charging of the input capacitance 54 is cumulative. In other words, if e.g., the resistance element 15-9 had been left in the DAC 14 output circuit at the end of the first conversion step, by the time the second step was reached, the capacitor 54 would have substantially charged to the full value corresponding to the resistor 15-9. Thus the settling or transient response errors introduced in the comparator 17 on the next step would only relate to the change in DAC 14 output signal at that step. As a result, the comparison error becomes progressively smaller in absolute value with each successive step.

In the embodiment of FIG. 1 and in the example given above, a pair of impedance elements 15 are switched into the DAC 14 output circuit at each conversion step, except for the last few steps. This is desirable to ensure that if a particular unknown analog input value is bridged by the error limits of the comparator 17 (as in the example given above at step 2), that the value of the non-retained impedance element 15 will be made up by a sum of later-included impedance elements.

Furthermore, the insertion of a pair of impedance elements at each conversion step also ensures accurate results in the event of an overestimation by the comparator 17. Suppose, for example, that only one element, having a nominal value of 115.5 were used in the comparison, and that the error of the comparator is ±3%. A high output would indicate that the unknown analog input signal has a value which is greater than 115.5−(3% of 115.5)=112, and a low output would indicate that the unknown signal is less than 115.5+(3% of 115.5)=119.

If the unknown input has an actual value of say, 113.0 and the comparator gives a high (overestimation) output, the single term 115.5 would be retained. But this value is higher than the actual analog input of 113.0. Thus an error is introduced which could not be made up during subsequent steps. However, by including a pair of impedance elements in the conversion steps, and retaining only one of these in the event of a high output from the comparator, the foregoing source of error is completely eliminated.

Advantageously, but not necessarily, the value of the second impedance element combined with the highest-value impedance element at the first conversion step is approximately equal to half of the overlap between the magnitude of that largest element and the sum of all of the elements of lesser value. For example, in the non-binary sequence exemplified by Table I, the highest value element has a nominal value of $1.8^9 = 198.359$. The sum of all of the lower terms $1.8^0$ through $1.8^8$ is 246.700, or an overlap of approximately (246.7−198.4=48.3). One-half of this overlap is 24.15; the element having the next largest nominal value to this one-half overlap is the series term $1.8^6$ with a nominal value of 34.012. This is selected as the second term for the first comparison step. Note that if the largest term is erroneously dropped during the first comparison step it still can be adequately compensated for on successive steps.

In the embodiment of FIG. 1, in most of the comparison steps the circuitry 16 causes two impedance elements 15 to be actuated. This corresponds to the inclusion of two terms of the series $ka^n$ in each comparison step. However, the invention is not so limited. Thus it is possible to include three or more such series terms in each comparison step. Further, the invention is not limited to the non-binary sequence $ka^n$, but may employ other sequences in which the value of a particular term is less than the sum of the remaining, individually lesser-valued terms in the series.

The entire inventive successive approximation A/D converter may be fabricated as an integrated circuit. The individual impedance elements 15 may either be fabricated directly on the integrated circuit, or may be separate components which are electrically connected thereto. In either case, the actual value memory 20 may comprise a read-only memory which is preprogrammed at the time of manufacture to contain the actual values of the impedance elements 15. The actual values may be obtained by measurement of the individual impedance components after they are manufactured. As noted above, these elements need not be manufactured to the precise values corresponding exactly to the terms in the non-binary series which is employed in the converter.

The digital-to-analog converter (DAC) 14 may be thought of as an analog generator. Other forms of analog generator may be used, so long as they are configured to produce reference analog signals having nominals values corresponding to the terms of the selected non-binary series, and so long as the exact values produced by the analog generator are known and are stored in the actual value memory 20.

Advantageously, the unknown analog input that is supplied to the inventive converter 10 is of constant value throughout the conversion cycle. To this end, a sample and hold circuit (not shown) may be used to sample the analog signal to be converted, and to supply the constant held value to the input line 12 during the conversion cycle.

I claim:

1. In a successive approximation type analog-to-digital converter wherein the unknown analog input is successively compared with reference signals having stepped values from an analog generator, wherein said reference signals are related by a selected series, the improvement wherein digital equivalents of the actual step values produced by said analog generator are stored in an actual value memory, and including digital summing means for summing the stored digital equivalents of the actual step values included in the analog reference signal that results in the closest comparison with the unknown analog input to obtain a digital representation of said analog input, whereby the digital representation will be accurate despite inaccuracies in the reference signals with respect to the selected series.

2. A successive approximation converter according to claim 1 wherein said series is a non-binary series wherein the value of each term above some specific term is less than the sum of the values of all preceding terms in the series.

3. A successive approximation converter according to claim 2 wherein said series is of the form $ka^n$ where k is any constant, where $1 < a < 2$ and where $n = 0, 1, 2, \ldots, (N-1), N$.

4. A successive approximation converter according to claim 2 wherein said analog generator includes a set of impedance elements which establish the stepped values of said produced reference signals and wherein said actual value memory stores the exact values established by said impedance elements.

5. In a successive approximation type analog-to-digital converter wherein the unknown analog input is successively compared with reference signals having stepped values from an analog generator, the improvement wherein digital equivalents of the actual step values produced by said analog generator are stored in an actual value memory, and including digital summing means for summing the actual step values included in the analog reference signal that results in the closest comparison with the unknown analog input to obtain a digital representation of said analog input, wherein said analog generator produces reference signals having stepped values that are related by a non-binary series of the form $ka^n$ where k is any constant, where $1 < a < 2$ and where $n = 0, 1, 2 \ldots, (N-1)$, N and wherein said analog generator produces (N+1) successive reference signals, each reference signal including at least one term $ka^{n'}$ for successive values of $n' = N, (n-1), (N-2) \ldots, 2, 1, 0$ in that order where $ka^{(N-d)}$ is the term in said series $ka^n$ having a value next greater than $$\tfrac{1}{2}\left[\left(\sum_{n=0}^{N-1} ka^n\right) - ka^N\right].$$

6. An analog-to-digital converter comprising:

means for establishing reference analog values which are related by the series $ka^n$ where $1 < a < 2$ and $n = 0, 1, 2, \ldots, (N-1), N$;

clock controlled means, cooperating with said means for establishing, for sequentially producing successive approximate values $k(a^{n'} + a^{n''})$ where $n' = N, (N-1), \ldots, 2, 1, 0$ and $n'' = (N-d), (N-d-1), (N-d-2), \ldots 2, 1, 0$ and where N d 1;

comparator means for comparing an unknown analog input with the successive values produced by said clock controlled means, and for retaining and including in each successive comparison in addition to the approximate values $k(a^{n'} + a^{n''})$ the first approximate term $ka^{n'}$ from each prior comparison in which the unknown analog input was greater than the compared successive value including prior retained terms; and accumulator means for summing digital equivalents of the actual values of all of the retained terms to obtain a digital output value indicative of said unknown analog input, whereby said digital output will be an accurate representation of the analog input despite inaccuracies of the reference analog values with respect to the series $ka^n$.

7. An analog-to-digital converter according to claim 6 having a set of impedance elements selected to provide said reference analog values which do not precisely correspond to said sequence values $ka^n$ and further comprising:

a memory storing the actual reference analog values produced by each of said impedance elements, said accumulator means summing actual values obtained from said memory.

8. An analog-to-digital converter according to claim 7 wherein said comparator means comprises an analog comparator circuit receiving as inputs to be compared said unknown analog input and said successively produced values, said comparator circuit being strobed by said clock controlled means so as to provide an output indicative of the relative magnitudes of the compared inputs at the time of strobing, said converter providing an accurate output value even though at said time of strobing said comparator circuit has not settled sufficiently completely to give a totally error-free output.

9. An analog-to-digital converter comprising:

means for establishing reference along values which are approximately related by the series $ka^n$ where $1<a<2$ and $n=0, 1, 2, \ldots, (N-1), N$;

clock controlled means, cooperating with said means for establishing, for sequentially producing successive values $(a^{n'}+a^{n''})$ where $n'=N, (N-1), \ldots, 2, 1, 0$ and $n''=(N-d), (N-d-1), N-d-2), \ldots 2, 1, 0$ and where $N>d>1$, wherein said clock controlled means cooperates with said means for establishing to product successive values in which $ka^{(N-d)}$ corresponds to the term in said series having a value next greater than $$\tfrac{1}{2}\left[\left(\sum_{n=0}^{N-1} ka^n\right) - ka^N\right];$$

comparator means for comparing an unknown analog input with the successive values produced by said clock controlled means, and for retaining and including in each successive comparison in addition to the value $(a^n+a^{n'})$ the first term $a^{n'}$ from each prior comparison in which the unknown analog input was greater than the compared successive value including prior retained terms, and accumulator means for summing the actual value of all of the retained terms to obtain a digital output value indicative of said unknown analog input.

10. An analog-to-digital converter comprising:

calibrated means for providing a set of progressively smaller comparison values of an analog parameter, each such value above a certain value being less than the sum of all succeeding values in said set, wherein said calibrated means includes a set of impedance elements having component magnitudes which establish said set of comparison values, said component magnitudes being selected to produce comparison values which are related by the terms of a non-binary series;

comparator means, including an analog comparator circuit, for successively comparing with an unknown analog input a new value consisting of the sum of (a) at least one of said progressively smaller comparison values and (b) for all compared values above said certain value, a second value from said set, said second value being greater than the maximum error introduced at each such comparison by said analog comparator circuit, and for determining if said unknown input is greater or less that the net value with which is is compared;

reference insertion means, cooperating with said comparator means and operative when said unknown input is greater than the compared net value, for retaining and including said at least one comparison value in all successive net values with which comparisons are made;

a memory storing in digital format the actual component magnitudes of said impedance elements; and an accumulator, cooperating with said reference insertion means, for summing the actual component magnitudes, obtained from said memory, of those impedance elements corresponding to said retained values, the final contents of said accumulator thereby accurately representing in digital format the unknown analog inputs despite inaccuracies in the impedance elements which result in errors in the comparison values with respect to the non-binary series.

11. An analog-to-digital converter according to claim 10 wherein said non-binary series is the series $ka^n$ where $n=N, (N-1), (N-2), \ldots, 2, 1, 0$ for $1<a<2$ and wherein k is a constant, and wherein each impedance element is a resistor which non-precisely establishes a comparison value approximately corresponding to a respective term in said series $ka^n$, the exact actual values of said resistors being stored in said memory.

12. An analog-to-digital converter according to claim 11 and contained on a single integrated circuit chip including a read-only memory preprogrammed to contain the actual values of said resistors as measured subsequent to fabrication thereof.

13. An analog-to-digital converter comprising:

analog generator means for producing a set of analog signals having values in a series of $ka^n$ where k is a constant, where $1<a<2$ and where $n=0, 1, 2 \ldots, (N-1), N$;

means for sequentially comparing subsets of said values with an unknown analog input and for determining if the value of said subset is smaller than said unknown input, and if so, for retaining at least one member of said subset for inclusion in all subsequent comparison subsets;

means for storing in digital format the exact actual value of each of said analog signals in said set; and means for digitally summing the stored actual values corresponding to all retained members of said subsets, the resulting digital sum being the converted analog input, whereby the digital sum is an accurate representation of the analog input despite inaccuracies in the analog signals with respect to the series $k^{an}$.

14. An analog to digital converter comprising:

means for generating a series of analog reference signals having nominal values;

means for sequentially comparing subsets of the analog reference signals with an unknown analog input, said subsets including at least one comparison term and at least one error compensation term, wherein an error compensation term from one subset is used as a comparison term in a subsequent subset;

means for retaining in all subsequent comparison subsets said at least one comparison term from a subset if the value of said subset is smaller than said unknown input;

means for storing in digital format the exact actual value of each of said analog signals in said series; and means for digitially summing the stored actual values corresponding to all retained members of said subsets, the resultant digital sum being the converted analog inputs, whereby the digital sum is an accurate representation of the analog input despite inaccuracies in the analog reference signals with respect to their nominal values.

15. The analog to digital converter of claim 14 wherein said means for generating includes:

a digital to analog converter including a set of impedance elements; and logic control means for selectively connecting at least two of said impedance elements to an output line of the digital to analog converter to provide said subsets, whereby a single set of impedance elements are utilized to generate both the comparison terms and the error compensation terms.

16. An analog to digital converter comprising:

a digital to analog converter including a set of impedance elements for generating a series of analog reference signals having nominal values;

a logic circuit for selectively and sequentially connecting at least two of said impedance elements to an output line of the digital to analog converter to provide subsets of said analog reference signals, each subset including at least one comparison term and at least one error compensation term, wherein an error compensation term from one subset is used as a comparison term for a subsequent subset;

a comparator circuit for sequentially comparing said subsets with an unknown analog input;

means for retaining in all subsequent comparison subsets said at least one comparison term from the subset if the value of said subset is smaller than said unknown analog input;

a memory for storing in digital format the exact actual value of each of the analog signals in the series; and means for digitally summing the stored actual values corresponding to all retained members of said subsets, the resultant digital sum being the converted analog input, whereby the digital sum is an accurate representation of the analog input despite inaccuracies in the impedance elements which result in errors in the reference signals with respect to their nominal values.

17. An analog to digital converter comprising:

a digital to analog converter including a set of impedance elements for generating a series of analog reference signals;

a logic circuit for selectively and sequentially connecting at least two of said impedance elements to an output line of the digital to analog converter to provide subsets of said analog reference signals wherein each subset includes at least one comparison term and at least one error compensation term and wherein an error compensation term from one subset is used as a comparison term for a subsequent subset, said logic circuit including first and second clock controlled counters whose outputs are connected to first and second decoders, respectively, and a first plurality of logic gates for coupling the outputs of the decoders to the digital to analog converter to control the connection of the impedance elements to the output line of the digital to analog converter;

a clock controlled comparator circuit for sequentially comparing said subsets with an unknown analog input;

means for retaining in all subsequent comparison subsets said at least one comparison term from the subset if the value of said subset is smaller than said unknown analog input, said means including (a) a second plurality of logic gates connected to the output of the comparator circuit and to the outputs of one of the decoders, (b) a plurality of flip flops whose inputs are connected to the outputs of the second plurality of logic gates and whose outputs are connected to the inputs of the first plurality of logic gates, and (c) a third plurality of logic gates whose inputs are connected to the outputs of both of the decoders and whose outputs are connected to the inputs of the first plurality of logic gates;

a memory for storing in digital format the exact actual value of each of the analog signals in the series; and means for digitally summing the stored actual values corresponding to all retained members of said subsets, the resultant sum being the converted analog input, said means including a memory access control, enabled by the output of the comparator circuit, for controlling the output of the memory, and an accumulator connected to the output of the memory.

* * * * *